(12) United States Patent
Thomas et al.

(10) Patent No.: US 8,611,103 B2
(45) Date of Patent: Dec. 17, 2013

(54) LATCHING INJECTOR/EJECTOR

(75) Inventors: Sean Thomas, San Francisco, CA (US); Saeed Seyed, Los Altos, CA (US); Hong Tran Huynh, Fremont, CA (US); Phillip S. Ting, San Jose, CA (US); Toan Nguyen, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 84 days.

(21) Appl. No.: 13/282,726

(22) Filed: Oct. 27, 2011

(65) Prior Publication Data

US 2013/0107424 A1    May 2, 2013

(51) Int. Cl.
*H05K 7/18*    (2006.01)

(52) U.S. Cl.
USPC ...... 361/801; 361/754; 361/679.58; 361/726; 361/798; 361/802

(58) Field of Classification Search
USPC ......... 361/726, 732, 740, 901, 759, 747, 754, 361/679.58, 727, 755, 801, 802, 803; 439/152; 16/110.1
See application file for complete search history.

(56) References Cited

U.S. PATENT DOCUMENTS

| | | | |
|---|---|---|---|
| 4,678,159 A * | 7/1987 | Gardner et al. | 251/107 |
| 5,414,594 A * | 5/1995 | Hristake | 361/755 |
| 6,912,132 B2 | 6/2005 | Riddiford et al. | 361/727 |
| 6,916,190 B2 * | 7/2005 | Joist | 439/160 |
| 6,956,745 B2 * | 10/2005 | Kerrigan et al. | 361/726 |
| 7,125,272 B1 * | 10/2006 | Liang | 439/160 |
| 7,264,490 B1 | 9/2007 | Reznikov | 439/152 |
| 7,292,459 B2 * | 11/2007 | Wang | 361/818 |
| 7,297,008 B2 * | 11/2007 | Griffin | 439/157 |
| 7,480,963 B2 * | 1/2009 | Liang | 16/422 |
| 7,499,271 B2 * | 3/2009 | Wagatsuma et al. | 361/679.33 |
| 8,035,961 B2 * | 10/2011 | Figuerado et al. | 361/679.37 |
| 8,289,707 B2 * | 10/2012 | Liao | 361/679.58 |
| 8,369,080 B2 * | 2/2013 | Huang | 361/679.38 |
| 8,416,563 B2 * | 4/2013 | Hou | 361/679.33 |
| 8,435,057 B1 * | 5/2013 | Jun et al. | 439/157 |
| 2010/0294905 A1 * | 11/2010 | Peng et al. | 248/222.12 |

* cited by examiner

*Primary Examiner* — Jinhee Lee
*Assistant Examiner* — Keith Depew
(74) *Attorney, Agent, or Firm* — Brinks Gilson & Lione (57) ABSTRACT

A latching apparatus provides selective injection and ejection of an electronic module relative to a chassis that includes a support member. The apparatus includes a housing to be coupled to the electronic module, and a handle pivotably coupled to the housing and movable between a latched position and an unlatched position. A catch in a first position retains the handle in the latched position. An actuator is coupled to the handle and operable to move the catch to a second position. In response to movement of the actuator in a direction the same as the direction of the handle toward the unlatched position, the catch is moved to its second position. As a result, the handle is movable between the latched and unlatched positions to permit the electronic module to be injected or ejected relative to the chassis.

19 Claims, 4 Drawing Sheets

LATCHING INJECTOR/EJECTOR

FIELD

The present disclosure relates to latching mechanisms, and in particular, to latching mechanisms for the injection and ejection of a module within electrical computer systems.

BACKGROUND

Electrical computer systems, such as computer servers, routers, switches, blade servers, or any other computing devices, typically are constructed in modular fashion. For example, multiple electronic modules, such as I/O cards, power supplies, disk drives, and fan tray assemblies, are generally coupled to the electrical computer system by a two-part multi-contact connector. A first part of the connector is electrically coupled to the circuit board(s), a backplane, or a bridge connector of the electrical computer system, whereas the second part is coupled to another component, such as a rack, a chassis, a cable, or another circuit board. Thus, successful mating of both connector parts is needed for reliable electrical connections and mechanical connections between the electronic module and the system.

The electronic module can have an ejector latch to facilitate injection and ejection from the electrical computer system. The ejector latch typically is used in conjunction with a remote release mechanism, such as a thumbscrew, a PEM nut, or an eject button, which aids in keeping the electronic module mechanically seated into the system in the case of shock or vibration. In an attempt to eject the electronic module, there are several steps required to release the ejector latch, and if not intuitive, a user is likely to break the ejector latch or the electronic module inadvertently. For example, a user may forget initially to disengage the remote release mechanism and consequently break or disable the ejector latch and/or the release mechanism or weaken the hinge connection of the ejector latch.

The risk of damage to the ejector latch or the electronic module is even higher when the electronic module has a relatively large number of pins, which consequently require larger injection and ejection forces to mate and disengage the connector parts. For example, the total injection and ejection force required can be up to 100-200 pounds or more. Furthermore, an electronic module with a larger number of pins can also increase the risk that individual contacts are damaged if the mating connector parts are not properly aligned when coming into contact with each other.

Thus, it is desirable to provide a latching mechanism to facilitate mating between an electronic module and an electrical computer system and a chassis body. Further, it is desirable to provide a more intuitive latching mechanism that reduces the number of steps to inject or eject the electronic module from the system and the chassis, thereby reducing the risk of damage to the latching mechanism, the electronic module, and/or the chassis body.

BRIEF DESCRIPTION OF THE DRAWINGS

The components and the figures are not necessarily to scale, emphasis instead being placed upon illustrating the principles of the example embodiments. Moreover, in the figures, like-referenced numerals designate corresponding parts throughout the different views.

DETAILED DESCRIPTION OF THE DRAWINGS

Overview

In one embodiment, an apparatus can include a housing formed to be fixedly coupled to an electronic module and a handle coupled to the housing at a pivot connection. The handle is pivotable about a pivot axis of the pivot connection in a first direction to a latched position and in a second direction to an unlatched position. In the latched position, the electronic module can be coupled to a support member included in a chassis in which the electronic module is installed. In the unlatched position, the electronic module can be permitted to move relative to the support member. A catch can be coupled to the housing. The catch is movable between a first position to retain the handle in the latched position and a second position to permit movement of the handle between the latched position and the unlatched position. An actuator can be coupled to the handle. The actuator is operable to move the catch to the second position. In response to movement of the actuator in a direction the same as the second direction of the handle, the catch is moved to the second position.

In another embodiment, a method can include one or more of the following steps. An electronic module selectively coupled to a support member and a latching apparatus are provided. The latching apparatus includes a housing coupled to the electronic module, a handle pivotably coupled to the housing, and a catch coupled to the housing. An actuator can be coupled to the handle. The handle can be in a latched position to retain the electronic module coupled to the support member. The catch can be in a first position to engage the handle and maintain the handle in its latched position. The actuator can be moved in a first direction to engage the catch and move the catch to a second position away from engagement with the handle. The handle, with the catch in the second position, can be moved in a direction the same as the first direction of the actuator to an unlatched position to decouple the electronic module from the support member.

Example Embodiments

The following description generally relates to apparatus and methods for injecting and ejecting electronic modules from computer systems for a variety of industry applications. Such nonlimiting applications can include telecommunication network server systems, web server systems, LAN application and file server systems, personal computer systems, and vehicle control systems. The electronic module can be any kind of modular unit or subsystem. Nonlimiting examples of electronic modules include a printed circuit board assembly, an information-processing cartridge, a fan tray assembly, a disk drive, a memory module, a power supply, or any combination thereof.

Figure 1:
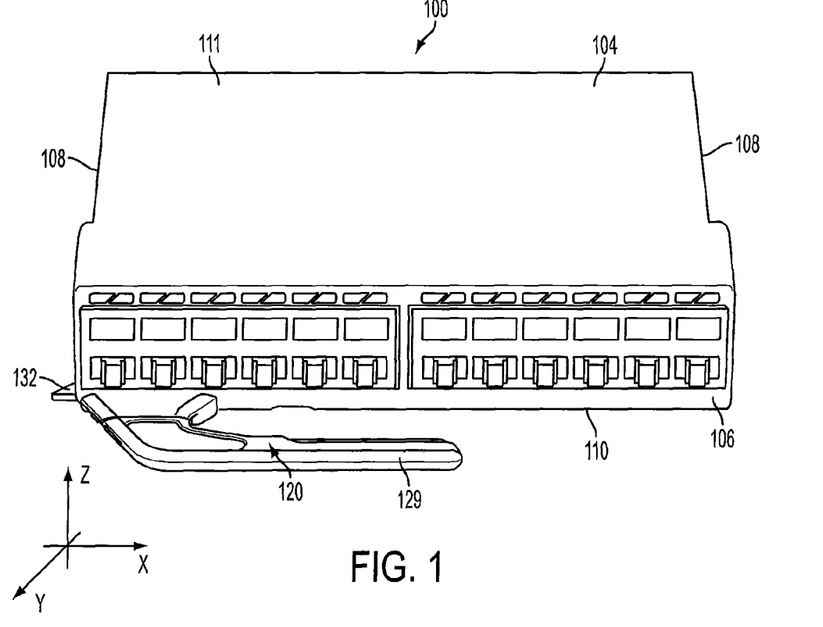
FIG. 1 is a perspective view of one embodiment of an electrical module and a latching mechanism coupled thereto.

FIG. 1 illustrates one embodiment of an electronic module 100. One exemplary electronic module is an I/O card including a switch fabric card for a networking system. One exemplary module is the CISCO CATALYST 4500 E-series Supervisor Card 6L-E, which is commercially available from Cisco Systems Inc. (San Jose, Calif.). The electronic module 100 may include a module chassis 104. The chassis 104 can include a face panel 106, a rear panel opposite the face panel, a pair of side panels 108, a base panel 110 and a top panel 111 opposite the base panel, which together can form a box shape. The electronic module 100 can include an electrical pin connector portion (not shown) on the rear panel to mate with a complimentary electrical mating connector portion of a backplane or bridge connector of a support member such as an electrical computer system (not shown). The electrical computer system can be computer equipment such as a computer server, a router, a switch, a blade server, a power supply, an input/output device, or any other computing device or computing system related equipment. One exemplary electrical computer system is the CISCO CATALYST 4000 Switch, which is commercially available from Cisco Systems Inc. (San Jose, Calif.). The electrical computer system can include a support member included in a chassis such as an equipment rack to accommodate the electronic module 100, for example, a chassis-mounted unit, or a rack-mounted unit in a computer server rack, which is typically sized to dimensional standards as set forth by the Electronic Industries Alliance (EIA). The EIA has defined the mounting equipment in terms of a rack unit (RU), where each RU is 44.45 mm (1.75 inches) in height and 480 mm (19 inches) or 580 mm (23 inches) in width.

A latching mechanism 120 can be pivotably coupled to any surface or part of the electronic module 100, e.g., the base panel 110. The latching mechanism 120 is operable to selectively couple or decouple the electronic module 100 from a rack or a chassis and to inject or eject the electronic module 100 from an electrical and/or communication source. To aid in the orientation of the components in the figures, a coordinate system is provided having a first axis x, a second axis y, and a third axis z, each perpendicular to one another. For additional clarity, the first axis x extends generally between the side panels 108, the second axis y extends generally between the face panel 106 and the rear panel, and the third axis z extends generally between the base panel 110 and the top panel 111. Top, side, base orientations are simply examples, and any orientation of the electronic module 100 is possible in other examples.

Figure 2:
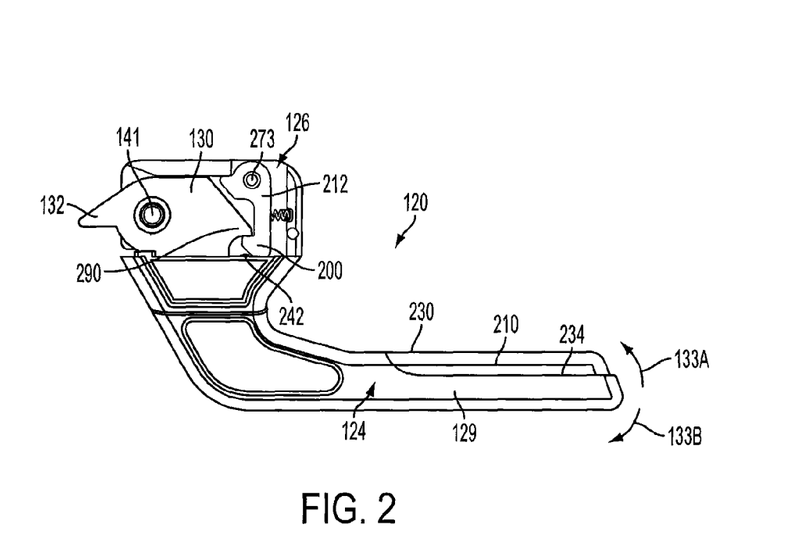
FIG. 2 is a top view of one example of a latching mechanism.

With additional reference to FIG. 2, the latching mechanism 120 includes a handle 124 pivotably coupled to a latch housing 126. The latch housing 126 can be coupled to any surface of the electronic module 100, e.g., the base panel 110. In one example, the latch housing 126 is fixed in a secured relationship with the electronic module 100 such that the handle 124 can move relative to each of the latch housing 126 and the electronic module 100. Various attachment mechanisms can be used to couple the latch housing 126 to the base panel 110 of the electronic module 100, such as, e.g., adhesives, welding, soldering, and/or mechanical fasteners such as screws or rivets. For example, a multiple point connection can be provided between the latch housing and the electronic module.

The handle 124 can include a gripping portion 129 and a jaw portion 130. The gripping portion 129 can be used by a user to operate the latching mechanism. The gripping portion 129 can extend out from the latch housing 126, e.g., in front of the electronic module as shown in FIG. 1. The jaw portion 130 can extend beyond the gripping portion 129 and within the latch housing 130, which can conceal a substantial portion of the jaw portion 130. The jaw portion 130 can have a first protruding member 132, which is shown in FIG. 1 extending out beyond a lateral side of the latch housing 126 and the side panel 108 of the electronic module 100. The first protruding member 132 is positionable within a receiving slot formed in the support member such as the chassis of the electrical computer system or the rack (e.g. a side rail), as described below. For example, the handle 124 is operable to selectively engage the first protruding member 132 within the receiving slot of the support member to form a coupling between the electronic module 100 and the support member. To form such coupling, the handle 124 is movable in a first direction, represented by arrow 133A, to a first, latched position. To decouple the electronic module 100 from the support member, the handle 124 is movable in a second direction, represented by arrow 133B, to a second, unlatched position. To this end, the handle 124 can move repetitively in the first and second directions between the latched and unlatched positions in order to inject or eject the electronic module 100 relative to the support member. In one example, when the handle 124 is at the latched position, the gripping portion 129 of the handle 124 is oriented along the face panel 106 in the direction of the first axis x, as shown in FIG. 1. The handle 124 can be moved away from its latched position toward the unlatched position in the second direction away from the face panel 106 so that the gripping portion 129 of the handle is out of alignment with the first axis x.

Figure 3:
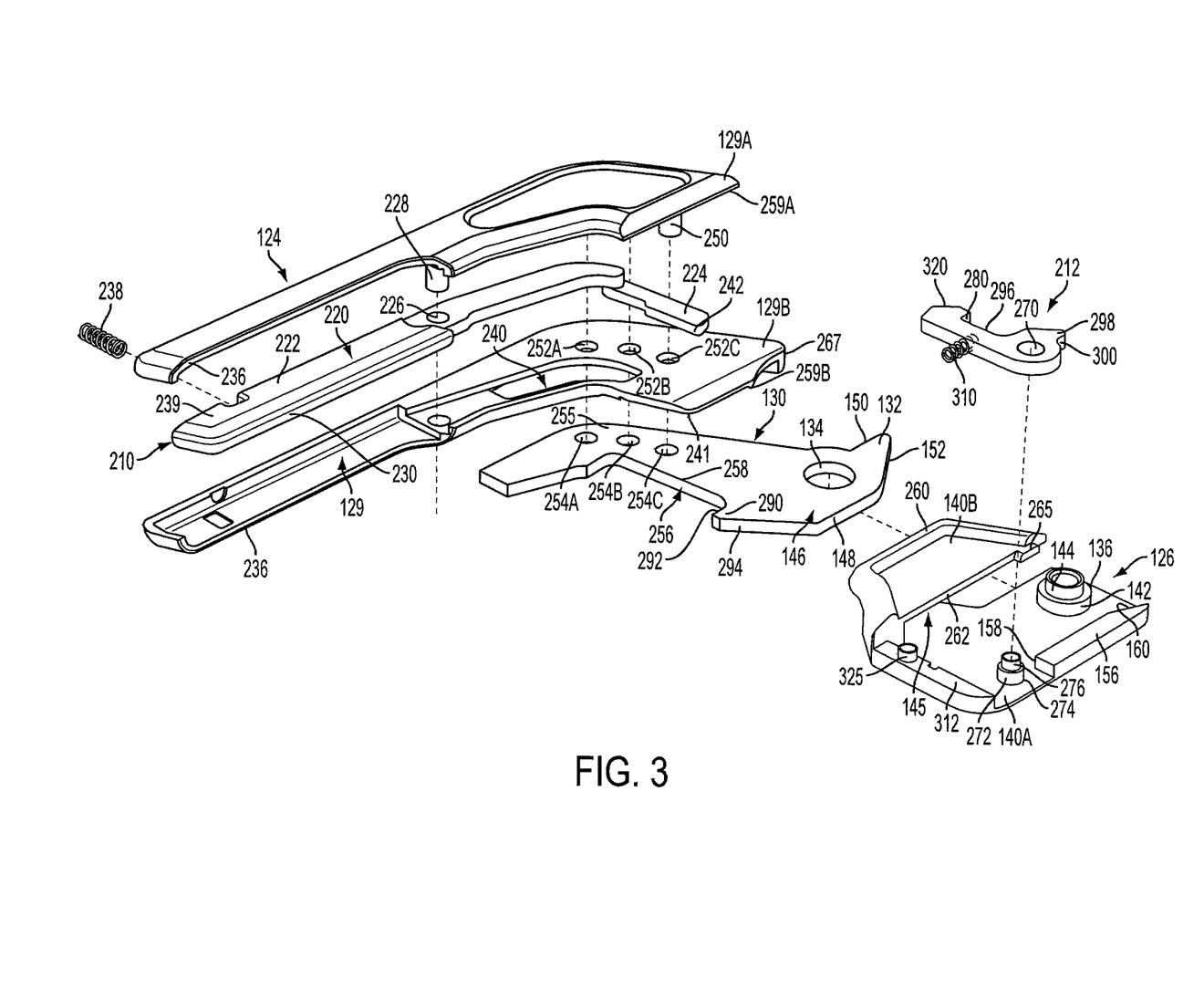
FIG. 3 is a perspective exploded view of the latching mechanism of FIG. 2.

FIG. 3 illustrates an exploded view of the latching mechanism 120. The gripping portion 129 and the jaw portion 130 can be coupled to one another in a secured relationship to form a unified structure, such as, e.g., adhesives, welding, soldering, and/or mechanical fasteners such as screws or rivets. For example, the gripping portion and the jaw portion may be formed of components that are rigidly joined together, such as described herein, or may be formed integrally into a monolithic structure. To this end, pivoting of the gripping portion 129 will cause the jaw portion 130 to pivot in a similar manner. The jaw portion 130 can include a pivot bore 134 formed therein. The pivot bore 134 can be coupled to a first pivot post 136 protruding from a base surface 140A of the latch housing 126 to form a pivot connection 141 about an axis of the post between the handle 124 and the latch housing 126, as shown in FIG. 2. The first pivot post 136 includes a large diameter portion 142 for receiving the pivot bore 134. The first pivot post 136 can also include a smaller diameter portion 144 adjacent the portion 142 at the tip of the post 136. The smaller diameter portion 144 can be extended through a first aperture formed in the base panel 110 of the electronic module for a first point of mechanical connection, such as a riveted connection, between the latching mechanism and the electronic module. The jaw portion 130 can be made of any material known in the art such as any metal including steel. The material is selected so that the jaw portion can maintain the low profile and exhibit high tensile strength to withstand the forces during operation. The jaw portion 130 can be made by any process known in the art such as molding, machining, or stamping.

The latch housing 126 may also include an elevated surface 140B positioned over the base surface 140A to define a cavity 145. The head 146 of the jaw portion 130 is sized to fit within the cavity 145 of the latch housing 126 so that the bore 134 is fitted over the first pivot post 136 to form the pivot connection 141. The head 146 can include a planar portion 148 that is positioned in a direction along the first axis x when the handle 124 is in the latched position. The jaw portion 130 can include an injection leverage surface 150 and an ejection leverage surface 152. The injection leverage surface 150 can engage with the edge that defines a portion of the receiving slot of the support member in order to create a moment and injection force suitable to overcome the insertion forces associated with the corresponding electronic connector portions. The ejection leverage surface 152 can engage with the opposite edge that defines another portion of the receiving slot of the support member, as shown in FIG. 5B, in order to create a moment and ejection force suitable to overcome the static forces associated with the corresponding coupled electronic connector portions. In one example, the injection leverage surface 150 defines a portion of the first protruding member 132. In one example, the ejection leverage surface 152 defines a portion of the first protruding member 132. In another example, the injection and ejection leverage surfaces 150, 152 converge to define the first protruding member 132. The injection leverage surface 150 can be positioned in a direction along the first axis x when the handle 124 is in the latched position to be substantially parallel with the planar portion 148. The ejection leverage surface 152 can be acutely angled (e.g., about 40-50 degrees) relative to the first axis x, and may interconnect the injection leverage surface 150 to the planar portion 148.

The latch housing 126 can include a first standoff member or rib 156 protruding outward away from the base surface 140A. In one example, the first rib 156 is positioned along an edge of the base surface 140A opposite to the entry point of the jaw portion 130 within the cavity 145. The first rib 156 can include a first surface 158 that occupies a plane defined by the first axis x and the third axis z. The first surface 158 may be a first physical stop to limit the degree of pivot of the handle 124 in the first direction, such that the latched position of the handle is predefined. At this latched position, the planar portion 146 of the jaw portion 130 may be positioned in close proximity to, and may even contact, the first surface 158 of the first rib. The first rib 156 can include a second surface 160 formed in a plane that is angled away from the plane of the first surface 158 defined by the first axis x and the third axis z. The second surface 160 may be a second physical stop to limit the degree of pivot of the handle 124 in the second direction, such that the unlatched position of the handle is predefined. At this unlatched position, the angled surface 152 of the jaw portion 130 may be positioned in close proximity to, and may even contact, the second surface 158. The latch housing 126 can be made of any rigid material and by any process such as molding, machining, or casting.

In order to facilitate maintaining the handle 124 at the latched position, the leverage mechanism 120 may include a release system 200. The release system 200 is operable to define a locked position and a release position between the release system 200 and the handle 124. In one example, the release system 200 is operable from the handle 124 so that a user can use a single hand to move the release system 200 to the unlocked position, as well as move the handle 124 to the unlatched position, in a single action. In other words, the direction of ejection and injection of the electronic module 100 can be the same as the directional movement of the handle 124 and/or the release system 200, thereby preferably creating an intuitive interface between a user and the electronic module to reduce damage to the components and mitigate user error. In other examples, the direction of ejection and injection of the electronic module 100 can be opposite the directional movement of the handle 124 and/or the release system 200.

FIGS. 2 and 3 depict one example of the release system 200. The release system 200 can include an actuator 210 and a catch 212. With actuation of the actuator 210, the catch 212 is movable between a first, locked position to retain the handle 124 at the latched position, and a second, release position to permit movement of the handle 124 between the latched position and the unlatched position.

The actuator 210 can be positioned anywhere on the handle 124. In one example, the actuator 210 is positionable within a cavity of the gripping portion 129 of the handle 124, such as when the gripping portion 129 comprises two half portions 129A, 129B. The actuator body 220 can be L-shaped to include a first leg member 222 and a second leg member 224, which may be substantially perpendicular to the first leg member 222. The actuator body 220 can be pivotably coupled to the handle 124. For example, the first leg member 222 can include a pivot aperture 226 formed therein, such as formed in an intermediate portion of the first leg member, which is sized to receive a pivot post member 228. The pivot post member 228 may extend from any interior surface of the gripping portion 129, such as from the half portion 129A. To this end, movement of the first leg member 222 can cause the actuator body 220 to be pivoted about the axis of the pivot post member 228 to move the second leg member 224 between a first position where the catch 212 remains in its locked position and a second position where the second leg member 224 engages and moves the catch 212 to the release position.

The actuator 210 can remain at least partially concealed within the cavity defined by the half portions 129A, 129B. In one example, the first leg member 222 can include an accessible engaging surface 230 that extends outwardly from a slotted region 234 formed in the gripping portion 129, as shown in FIG. 2. For example, the slotted region 234 can be defined by a notched area 236 formed in each of the half portions 129A, 129B. The half portions can be made of any material and by any process such as molding, machining, or casting. A biasing member 238, such as a spring, can be coupled between the actuator 210 and the handle, such as e.g., the gripping portion 129. For instance, the biasing member 238 can be coupled between the interior surface of the half portions 129A, 129B and proximate an end 239 of the first leg member 222. The biasing member 238 is configured to bias the actuator 210 in one of its positions, such as in the first position so that the catch 212 is maintained in its locked position. To this end, a user can apply a force to the surface 230 of the actuator 210 suitable to overcome the biasing force of the biasing member 238 in order to move the actuator from the first position to the second position. The actuator can be made of any material and by any process such as molding, machining, or casting.

The second leg member 224 can be offset along the third axis z from the first leg member 222, as shown in FIG. 3. The second leg member 224 that is offset may be extended through an opening 240 formed in one of the half portions 129A, 129B, such as the second half portion 129B. The degree of offset is about the thickness of the corresponding half portion, so that the second leg member 224 is placed adjacent to the underneath surface 241 of the half portion 129B. This arrangement can permit the tip 242 of the actuator 210, which is at the end of the second leg member 224, to be extended within the cavity 145 of the latch housing 126.

FIG. 3 depicts an example of the attachment between the half portions 129A, 129B and the jaw portion 130. Here, one of the half portions, such as the half portion 129A, includes one or more attachment posts 250 (three shown) extending from the interior surface of the half portion. Each of the posts 250 can be inserted through post openings (three post openings 252A, 252B, 252C) formed in one of the half portions, such as the second half portion 129B, as well as the post openings (three post openings 254A, 254B, 254C) formed in the jaw portion 130 when aligned with one another. The posts 250 after being inserted within the respective post openings can form a secured relationship through an interference fit or by various attachment mechanisms, such as, e.g., adhesives, welding, soldering, and/or mechanical fasteners such as screws or rivets. Although the jaw portion 130 can be oriented underneath the second half portion 129B, the tail 255 of the jaw portion 130 can be attached with the cavity defined by the half portions 129A, 129B. To this end, the jaw portion 130 can have a clearance notch 256 formed in the side 258 of the jaw portion 230 to provide clearance for the second leg member 224 to move during actuation of the actuator.

When the half portions 129A, 129B and the jaw portion 130 are coupled together, the head 146 of the jaw portion 130 can extend out beyond the respective ends 259A, 259B of the half portions 129A, 129B. When the head 146 is inserted into the cavity 145 of the latch housing 126, the ends 259A, 259B of the half portions can be placed in a confronting relationship with the first end 260 of the elevated surface 140B of the latch housing 126. The head 145 can extend beyond the second end 262 of the elevated surface 140B in order to be coupled to the latch housing as described herein. When coupled to the electronic module 100, the second end 262 can be placed into a contacting relationship with the face panel 106. The distance between the first and second ends 260, 262 of the surface 140B can extend the gripping portion 129 of the handle 124 out away from the face panel 106. Such distance provides clearance for the hand of a user to be placed between the face panel 106 and the gripping portion 129 for operation of the handle 124. Further, the tip 242 of the actuator 210 may extend out beyond the respective ends 259A, 259B of the half portions 129A, 129B. When inserted into the cavity 145 of the latch housing 126, the tip 242 may extend slightly outwardly beyond the second end 262 of the elevated surface 140B, as shown in FIG. 2, for engagement with the catch 212. To maintain the latching housing 126 fixed to the electronic module 100, the housing 126 may include a tab 265 for insertion into a receiving aperture (not shown) formed in the face panel 106. For example, the tab 265 can extend outwardly from the second end 262. A leverage point 267, such as the rounded corner of the second half portion 129B, can be relatively thicker than the adjacent portions of the half portion. During ejection of the electronic module, the leverage point 267 may contact the support member during rotation of the handle to provide a mechanical advantage for overcoming the static forces of the electrical connections between the module and the support member, as will be explained.

The catch 212 can be pivotably coupled to the latch housing 126 to be in close proximity with the jaw portion 130. The catch 212 is movable between the locked position with the jaw portion 130 of the handle 124 and the release position away from the jaw portion 130. To this end, the latch housing 126 can provide a housing or a support for both of the jaw portion 130 and the catch 212 to conceal these components therein. For example, the catch 212 can include a pivot bore 270 formed therein. The pivot bore 270 can be coupled to a second pivot post 272 protruding from the base surface 140A of the latch housing 126 to form a second pivot connection 273, as shown in FIG. 2. The second pivot post 272 can include a large diameter portion 274 for receiving the pivot bore 270. The first pivot post 272 can also include a smaller diameter portion 276 adjacent the portion 274 at the tip of the post 272. The smaller diameter portion 276 can be extended through a second aperture formed in the base panel 110 of the electronic module for a second point of mechanical connection, such as a riveted connection, between the latching mechanism and the electronic module.

The catch 212 can include a lip 280 for selective engagement with a portion of the jaw portion 130. For example, the jaw portion 130 can include a second protruding member 290, which is shown disposed on the other side of the pivot connection 141, opposite to the first protruding member 132, as shown in FIG. 2. The jaw portion 130 can include a first engaging surface 292 and a second surface 294 which converge to define the shape of the second protruding member 290. The first engaging surface 292 can be positioned in a direction along the first axis x when the handle 124 is in the latched position to be substantially parallel with the planar portion 148. The second surface 294 can be acutely angled (e.g., about 50-70 degrees) relative to the first axis x, and may interconnect the first engaging surface 292 to the planar portion 148.

The second protruding member 290 is positionable within a notched region 296 formed in the catch 212, which may be formed adjacent to the lip 280. When the handle 124 is in the latched position, the second protruding member 290 can reside within the notched region 296 of the catch 212. In particular, engagement between the lip 280 of the catch 212 and the first engaging surface 292 of the second protruding member 290 can maintain the handle 124 in the latched position. Movement of the catch 212 to the release position disengages the lip 280 from the first engaging surface 292 of the second protruding member 290 of the handle.

To maintain the catch 212 in its locked position, the catch 212 can include a protruding member 298. The protruding member 298 can include an engaging surface 300 that is contactable with an end portion of the first surface 158 of the first rib 156 when the catch 212 is in the locked position. The protruding member 298 can extend outward from the same side of the catch 212 as the lip 280, and may be positioned proximate the pivot bore 270. To this end, as the catch 212 pivots about the axis of the second pivot post 272 in a direction toward the locked position, the protruding member 298 contacts the first rib 156 at a first physical stop to prevent any further rotation in the corresponding direction. A biasing member 310, such as a spring, can be coupled between the catch 212 and the latch housing 126, such as a second rib 312. Although the biasing member 310 can be coupled in a variety of arrangements for its intended purpose, the biasing member 310 is shown coupled between the interior surface of the second rib 312 and proximate an intermediate region of the catch 212 opposite the lip 280 and the protruding member 298. The biasing member 310 is configured to bias the catch 212 in one of its positions, such as in the locked position so that the handle is maintained in the latched position. To this end, a user can apply a force to the actuator 210 to move the tip 242 of the actuator 210 in engagement with a confronting surface 320 of the catch 212. The force transmitted to the tip 242 is sufficient to overcome the biasing force of the biasing member 310 in order to pivot the catch 212 to its release position to permit the handle to move toward its unlatched position. The catch 212 can pivot in a direction toward the second rib 312, which as a second physical stop can prevent any further rotation in that corresponding direction. After the second protruding member 290 of the jaw portion 130 has cleared the lip 280 of the catch 212, the biasing member 310 can urge the catch 212 to return to its locked position.

The second rib 312 may also have a third post 325 protruding from the top surface of the second rib. The third post 325 can be extended through a third aperture formed in the base panel 110 of the electronic module for a third point of mechanical connection, such as a riveted connection, between the latching mechanism and the electronic module. It is recognized that the top surfaces of the first rib 156, the second rib 312, and the large diameter portions of the first and second pivot posts 136, 272 can be coplanar. Such coplanar surfaces permit the respective top surfaces to be placed in contact with the confronting surface of the panel 110 of the electronic module 100 after the attachment is formed between the latching housing 126 and the electronic module 100.

Figure 4:
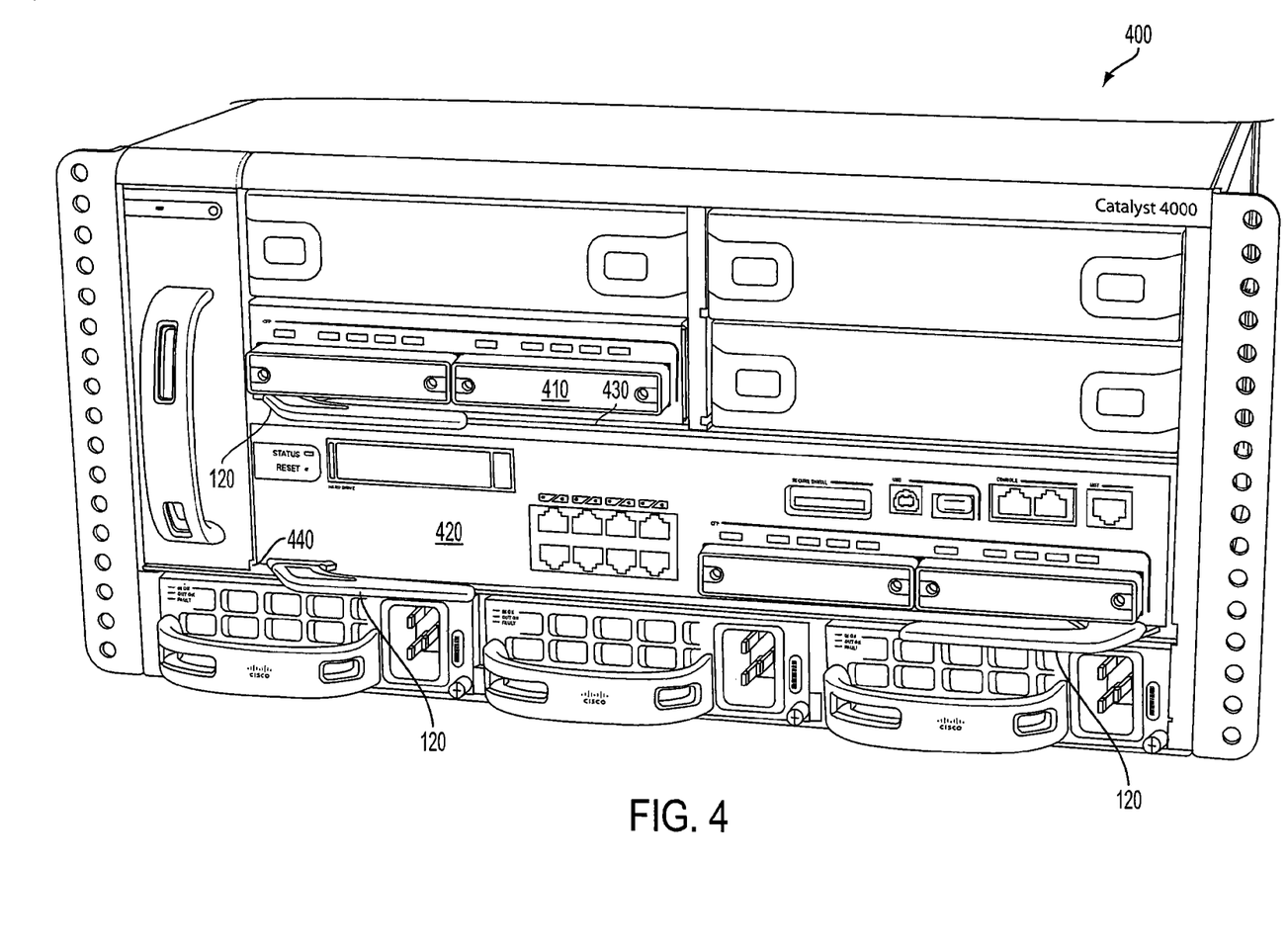
FIG. 4 illustrates one example of a support member having a pair of electronic modules coupled thereto.

FIG. 4 illustrates one exemplary support member 400, which includes a plurality of electronic modules, such as a first electronic module 410 and a second electronic module 420. Each of the modules has the latching mechanism 120 in the latched position. A small space 430 is formed along the corresponding attachment surface, such as, e.g., the bottom panel of the module, which allows the latching mechanism to be mounted offset from the face panel and operable from the attachment surface. This offset mounting configuration can leave the face panel substantially unobstructed by the latching mechanism and allow a user substantially full access to the face panel of the module. For instance, the entire area of the front panel of an electronic module, such as an I/O card, can be provided with electrical and/or communication ports without substantial obstruction from the relatively thin latching mechanism, such as shown in FIG. 1. The second electronic module 420 is an example module having a pair of latching mechanisms each located along opposite side panels of the module. More than one latching mechanism can be beneficial to overcome relatively high injection or ejection forces and for improved distribution of the forces along the module. For example, higher forces are created when the electronic module is longer or has a higher number of electrical mating connections. FIG. 4 also illustrates U-shaped channels 440 formed in the support member 400. The channels 440 guide the tip of the first protruding member when moving the module relative to the support member.

Figure 5A:
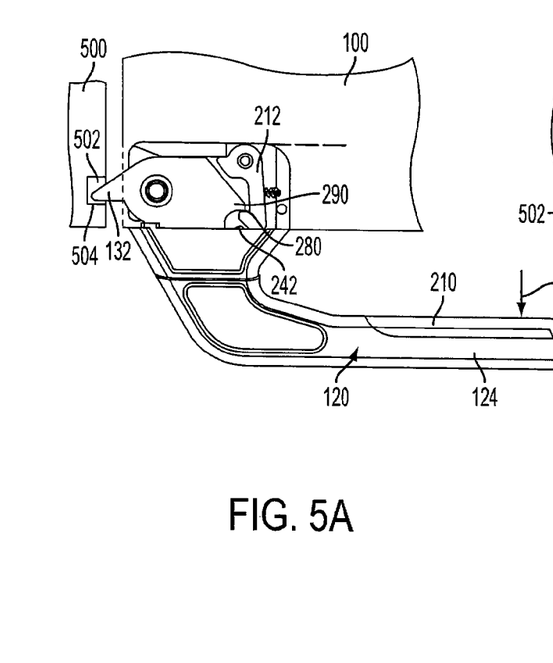
FIGS. 5A-5C illustrate an exemplary operation of the latching mechanism of FIG. 2.
Figure 5B:
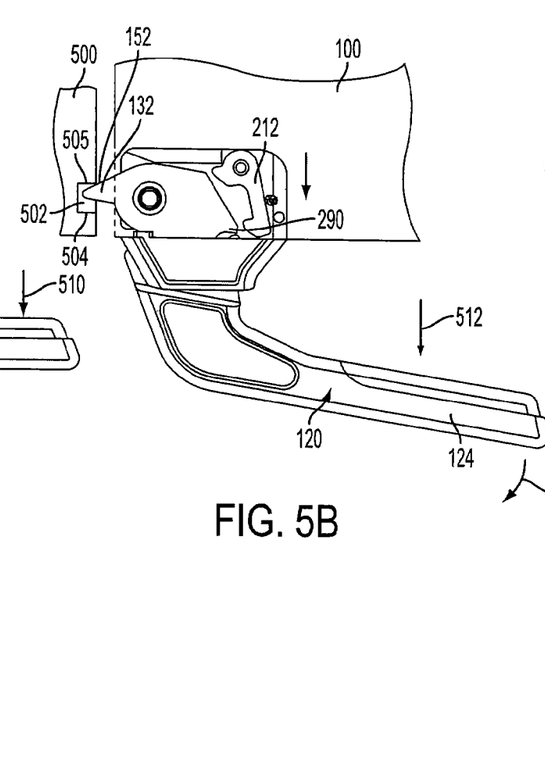
Figure 5C:
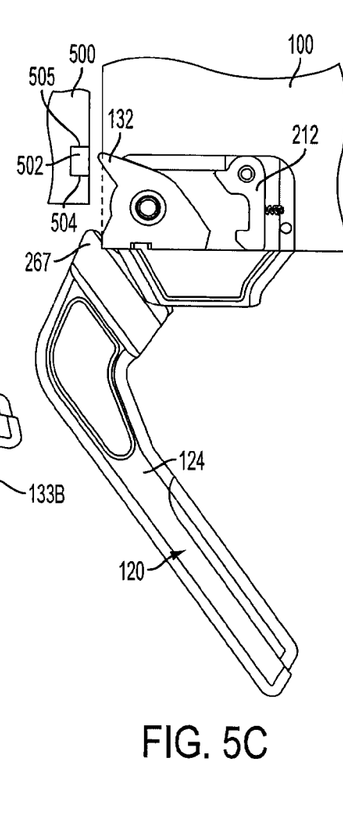

With reference to FIGS. 5A-5C, the operation of the latching mechanism 120 for ejection and injection of the electronic module 100 with the support member 500 will now be described. FIG. 5A illustrates the electronic module 100 injected within the support member 500 and the handle 124 of the latching mechanism 120 in the latched position. Here, the coupling between the module 100 and the support member 500 includes a two-part connection. For example, a first part of the connection, which is not shown in the figures, is an electrical connection with the support member 500, such as a multi-pin electrical connection. A second part is a mechanical connection with the support member 500 where the first protruding member 132 is received into a receiving slot 502 formed in the support member 500 to form a secured connection. The catch 212 is in the locked position to maintain the handle 124 secured in the latched position. To this end, the first edge 504 of the receiving slot 502 and the lip 280 of the catch 212 physically maintain or lock the position of the respective first and second protruding members 132, 290 of the handle, and thus the electronic module 100 is prevented from being removed from the support member 500.

FIG. 5B illustrates the catch 212 moved to its release position and the handle 124 moved to an intermediate position between the latched position (FIG. 5A) and the unlatched position (FIG. 5C) to partially eject the module 100 from the support member 500. Prior to movement to the intermediate position, a user can apply a force, represented by arrow 510, to the actuator 210 in the direction away from the face panel of the module, as shown in FIG. 5A. The force is suitable to move the tip 242 of the actuator 210 against the catch 212 in order to move the catch 212 to its release position, which provides clearance for the second protruding member 290 as the handle is moved toward its unlatched position. With such clearance, a user can apply a second force, represented by arrow 512, to the handle 124 to move the handle in the direction 133B toward the unlatched position with a single action. In other words, a user with a single withdrawing action applied to the handle 124 as described herein can release the catch 212 and move the handle 124 toward the unlatched position. The ejection leverage surface 152 of the first protruding member 132 can then be positioned to engage the second edge 505 of the receiving slot 502. As the handle 124 is continued to be moved in the direction 133B, the engagement between the first protruding member 132 and the second edge 505 can create a moment and ejection force suitable to overcome the static forces associated with the corresponding coupled electronic connector portions. The module 100 can then begin to move outward relative to the support member 500. The length of the handle 124 can be sized to minimize the amount of the second force 512, such as to about 10-20 pounds, which is required to move the handle to its unlatched position. Such force and length can be determined by one skilled in the art to overcome up to about 200 pounds or more of injection or ejection forces formed by the electrical mating connections between the electronic module 100 and the support member 500.

FIG. 5C illustrates the module 100 moved away from the support member 500 and the handle 124 moved to its unlatched position. Here, the handle 124 is positioned such that first protruding member 132 is removed from the receiving slot 502 in order to clear the first edge 504 of the slot 502 and aligned within the U-shaped channel (not shown) formed in the support member 500. It is recognized that as the module is moved further out from the support member the tip of the first protruding member can be rotated further until the jaw portion engages the physical stop. The electronic module 100 can now be removed from the support member 500 by sliding the electronic module out of the cavity of the support member 500.

To inject the electronic module into the support member 500 the steps in reverse can be taken. For example, the electronic module 100 can be inserted into the cavity of the support member 500 and slid to a mating position. The handle 124 can be in the unlatched position so that the tip of the first protruding member 132 is received within the U-shaped channel formed in the support member 500 in order to be positioned for insertion into the receiving slot 502. The handle 124 can be moved in a direction opposite the direction 133B to cause the first protruding member 132 to move into the receiving slot 502 until the injection leverage surface of the jaw portion engages the first edge 504 of the receiving slot 502. This engagement can provide a mechanical advantage with the handle to overcome the injection forces, e.g., up to about 200 pounds, between the electrical mating connectors of the electronic module and the support member. The handle 124 can be moved until the handle reaches the latched position. Audible indication, such as a snap sound, can notify a user that a successful mating between the electronic module and the support member has been achieved. During rotation, the second protruding member of the jaw portion will move the catch out of the way to its release position. If biased, the catch will return to its locked position after the second protruding member has cleared the catch, thereby locking the handle in the latched position in order to secure the electronic module with the support member.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:
1. An apparatus comprising:
a housing formed to be fixedly coupled with an electronic module; and
a handle coupled to the housing at a first pivot connection, the handle pivotable about a pivot axis of the first pivot connection in a first direction to a latched position and in a second direction to an unlatched position,
wherein, in the latched position, the electronic module is coupled to a support member included in a chassis in which the electronic module is installed and,
in the unlatched position, the electronic module is permitted to move relative to the support member;
a catch coupled to the housing at a second pivot connection and
comprising a lip at a first end of the catch and a protruding member at a second end of the catch,
the catch pivotable about a pivot axis of the second pivot connection movable between a first position in which the lip is engageable with the handle to retain the handle in the latched position and
a second position in which the lip is disengaged from the handle to permit movement of the handle between the latched position and the unlatched position~
the protruding member of the catch contactable with a portion of the housing to inhibit movement of the catch beyond the first position; and
an actuator coupled to the handle,
the actuator operable to move the catch to the second position,
wherein, in response to movement of the actuator in a direction the same as the second direction of the handle, the catch is moved to the second position, and
wherein the housing comprises a base surface and at least one standoff protruding from the base surface to contact the electronic module so that a cavity is defined between the base surface of the latch housing and the electronic module.

2. The apparatus of claim 1, wherein the handle comprises a jaw portion at one end and a gripping portion at an opposite end, the jaw portion coupled to the housing at the first pivot connection to reside within the housing, and the gripping portion extending away from the jaw portion beyond the housing.

3. The apparatus of claim 2, wherein the catch is pivotably coupled to the housing adjacent the jaw portion.

4. The apparatus of claim 3, wherein the catch comprises a biasing member to bias the catch in the first position.

5. The apparatus of claim 1, wherein the actuator is pivotably coupled to the handle.

6. The apparatus of claim 5, wherein the actuator comprises a biasing member to bias the actuator in a position spaced away from the catch.

7. The apparatus of claim 1, wherein the handle comprises a first protruding member at a first side of the pivot connection, the first protruding member extendable beyond a lateral side of the housing to extend beyond a side of the electronic module.

8. The apparatus of claim 7, wherein the handle comprises a second protruding member on a second side of the pivot connection opposite to the first protruding member, the second protruding member engageable with the catch when the handle is in the latched position and the catch is in the first position.

9. The apparatus of claim 1, wherein the housing comprises a first physical stop and a second physical stop configured to limit movement of the handle to a predefined range of motion between the latched and unlatched positions.

10. The apparatus of claim 1, wherein the housing comprises a first physical stop and a second physical stop configured to limit movement of the catch to a predefined range of motion between the first and second positions.

11. A system comprising: an electronic module comprising a panel,
wherein the electronic module is to be selectively coupled to a support member included in a chassis in which the electronic module is installed; and
a latching mechanism comprising a latch housing coupled to the panel of the electronic module,
a handle pivotably coupled to the latch housing,
the handle pivotable about a first pivot axis between a latched position to retain the electronic module in a position relative to the support member and an unlatched position to permit movement of the electronic module relative to the support member,
a catch pivotably coupled to the latch housing,
the catch pivotable about a second pivot axis between a first position to retain the handle in the latched position and a second position to permit movement of the handle to the unlatched position, and
an actuator coupled to the handle,
the actuator operable to pivot the catch to the second position,
wherein, in response to movement of the actuator in a direction the same as the direction of the handle toward the unlatched position, the catch is pivoted to the second position;
wherein the latch housing comprises a base surface and
at least one standoff protruding from the base surface to contact the panel of the electronic module so that a cavity is defined between the base surface of the latch housing and the panel of the electronic module.

12. The system of claim 11, wherein the handle comprises a jaw portion at one end and a gripping portion at an opposite end of the handle, the jaw portion being pivotably coupled to the latch housing to reside within the latch housing, the gripping portion extending away from the jaw portion beyond the latch housing.

13. The system of claim 12, wherein the actuator comprises an engaging surface proximate the gripping portion of the handle, and a tip proximate the jaw portion of the handle to reside within the latch housing, wherein, in response to movement of the engaging surface of the actuator, the tip of the actuator movably engages the catch to pivot the catch to its second position.

14. The system of claim 11, wherein the handle comprises a jaw portion having a first protruding member on one side of a pivot connection and a second protruding member on an opposite side of the pivot connection, wherein the jaw portion is configured to reside within the cavity defined between the base surface of the latch housing and the panel of the electronic module.

15. The system of claim 14,
wherein the catch is disposed adjacent to the jaw portion within the latch housing,
the catch residing within the cavity defined between the base surface of the latch housing and the panel of the electronic module,
the catch having a lip in fixed engagement with the second protruding member when the handle is in the latched position and the catch is in the first position.

16. The system of claim 11, wherein the handle comprises a handle housing, and the actuator comprises an engaging surface pivotably coupled within the handle housing, and a tip extending beyond the handle housing to reside within the latch housing, wherein the engaging surface is pivotable between a first position where the tip is positioned relative to the catch such that the catch remains in the first position, and a second position where the tip contacts the catch to move the catch to the second position.

17. The system of claim 16, wherein the latching mechanism comprises a first biasing member coupled between the handle housing and the engaging surface of the actuator to bias the engaging surface in the first position, and a second biasing member coupled between the latch housing and the catch to bias the catch in the first position.

18. A method comprising: providing an electronic module selectively coupled to a support member and a latching apparatus, the latching apparatus comprising a housing coupled to the electronic module, the housing comprising a base surface and at least one standoff protruding from the base surface to contact the electronic module, the latching apparatus further comprising a handle pivotably coupled to the housing and received within a cavity defined between the base surface of the latch housing and the electronic module, a catch coupled to the housing, and an actuator coupled to the handle, wherein the handle is in a latched position to retain the electronic module coupled to the support member, and the catch is in a first position to engage the handle and maintain the handle in the latched position; moving the actuator in a first direction, wherein the actuator engages the catch and moves the catch to a second position away from engagement with the handle; and moving the handle, with the catch in the second position, in a direction the same as the first direction of the actuator to an unlatched position to decouple the electronic module from the support member.

19. The method of claim 18, wherein the moving the actuator step further comprises applying a force to the actuator suitable to overcome a biasing force of the catch.

* * * * *